United States Patent
Chinthakindi et al.

(10) Patent No.: US 7,166,913 B2
(45) Date of Patent: Jan. 23, 2007

(54) HEAT DISSIPATION FOR HEAT GENERATING ELEMENT OF SEMICONDUCTOR DEVICE AND RELATED METHOD

(75) Inventors: Anil K. Chinthakindi, Wappingers Falls, NY (US); Lawrence A. Clevenger, LaGrangeville, NY (US); Tom C. Lee, Essex Junction, VT (US); Gerald Matusiewicz, Poughkeepsie, NY (US); Conal E. Murray, Yorktown Heights, NY (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/907,873

(22) Filed: Apr. 19, 2005

(65) Prior Publication Data

US 2006/0231945 A1 Oct. 19, 2006

(51) Int. Cl.
*H01L 23/34* (2006.01)

(52) U.S. Cl. .................. 257/712; 257/536; 257/E23.08

(58) Field of Classification Search ................ 257/536, 257/712, 713, 717, 712 M, E23.08
See application file for complete search history.

(56) References Cited

U.S. PATENT DOCUMENTS

| | | | |
|---|---|---|---|
| 3,680,028 A | 7/1972 | Black et al. | |
| 4,365,805 A | 12/1982 | Levine | |
| 4,737,799 A * | 4/1988 | Kato | 347/203 |
| 4,894,612 A | 1/1990 | Drake et al. | |
| 5,057,908 A * | 10/1991 | Weber | 257/714 |
| 5,231,508 A | 7/1993 | Murphy, Jr. | |
| 5,319,319 A | 6/1994 | Kerth | |
| 5,428,339 A | 6/1995 | Das | |
| 5,481,905 A | 1/1996 | Pratt | |
| 5,599,595 A | 2/1997 | McGinley et al. | |
| 5,688,146 A | 11/1997 | McGinley et al. | |
| 6,121,104 A | 9/2000 | Dierschke et al. | |
| 6,203,387 B1 | 3/2001 | Daly et al. | |
| 6,458,255 B1 | 10/2002 | Chiang et al. | |
| 6,525,419 B1 * | 2/2003 | Deeter et al. | 257/712 |
| 6,642,877 B1 | 11/2003 | Leung | |
| 2002/0125986 A1 * | 9/2002 | Cabral et al. | 338/308 |

* cited by examiner

*Primary Examiner*—T. N. Quach
(74) *Attorney, Agent, or Firm*—Joseph Petrokaitis; Hoffman, Warnick & D'Alessandro LLC

(57) ABSTRACT

A structure and method are disclosed for heat dissipation relative to a heat generating element in a semiconductor device. The structure includes a plurality of heat transmitting lines partially vertically coincidental with the heat generating element, and at least one interconnecting path from each heat transmitting line to a substrate of the semiconductor device. In one embodiment, the heat generating element includes a resistor in a non-first metal level. The invention is compatible with conventional BEOL interconnect schemes, minimizes the amount of heat transfer from the resistor to the surrounding interconnect wiring, thus eliminating the loss of current carrying capability in the wiring.

15 Claims, 7 Drawing Sheets

HEAT DISSIPATION FOR HEAT GENERATING ELEMENT OF SEMICONDUCTOR DEVICE AND RELATED METHOD

BACKGROUND OF THE INVENTION

1. Technical Field

The present invention relates generally to semiconductor devices, and more particularly, to heat dissipation for a heat generating element in a semiconductor device.

2. Related Art

Heat dissipation in semiconductor devices continues to be a challenge as size continually shrinks. One particular element in semiconductor device structures that presents challenges relative to heat dissipation is a precision resistor, which represents an important element in microprocessor technology. For example, precision resistors are used to reduce parasitic capacitance in conventional advanced logic circuits. For technologies at 90 nm and smaller, refractory metal resistors embedded in the back-end-of-the-line (BEOL) (i.e., after first metal) are being used instead of polysilicon or single crystalline resistors due to their better resistance tolerance, lower thermal coefficient of resistance (TCR) and lower parasitic capacitance to transistors which are imbedded in the silicon. Unfortunately, the resistance of precision resistors ranges from about 60 to 100 Ohms/square, which under normal operating currents, generates substantial heat in and near the precision resistor. As a result, the temperature of the surrounding BEOL metallic interconnections also increases. Higher temperatures limit the performance of the precision resistors and degrade the electromigration performance of surrounding metal, which leads to lower maximum currents and increased complexity and cost to produce semiconductor microprocessors. Since no metal is allowed above or below the precision resistors, only heat transmission through typically very poor heat conductive dielectrics is possible.

In view of the foregoing, there is a need in the art for a way to dissipate the heat generation of precision resistors.

SUMMARY OF THE INVENTION

The invention includes a structure and method for heat dissipation relative to a heat generating element in a semiconductor device. The structure includes a plurality of heat transmitting lines partially vertically coincidental with the heat generating element, and at least one interconnecting path from each heat transmitting line to a substrate of the semiconductor device. In one embodiment, the heat generating element includes a resistor in a non-first metal level. The invention is compatible with conventional BEOL interconnect schemes, minimizes the amount of heat transfer from the resistor to the surrounding interconnect wiring, thus eliminating the loss of current carrying capability in the wiring.

A first aspect of the invention is directed to a structure for heat dissipation relative to a heat generating element in a semiconductor device, the structure comprising: a plurality of heat transmitting lines partially vertically coincidental with the heat generating element; and at least one interconnecting path from each heat transmitting line to a substrate of the semiconductor device.

A second aspect of the invention includes a heat dissipating structure for a resistor in a semiconductor device, the structure comprising: a plurality of heat transmitting metallic lines partially vertically coincidental with the resistor; and at least one interconnecting path from each heat transmitting metallic line to a substrate of the semiconductor device.

A third aspect of the invention is related to a method of dissipating heat from a heat generating element of a semiconductor device, the method comprising: providing a plurality of heat transmitting lines partially vertically coincidental with the heat generating element; and transmitting heat from each of the heat transmitting lines via at least one interconnecting path from each heat transmitting line to a substrate of the semiconductor device.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 1:
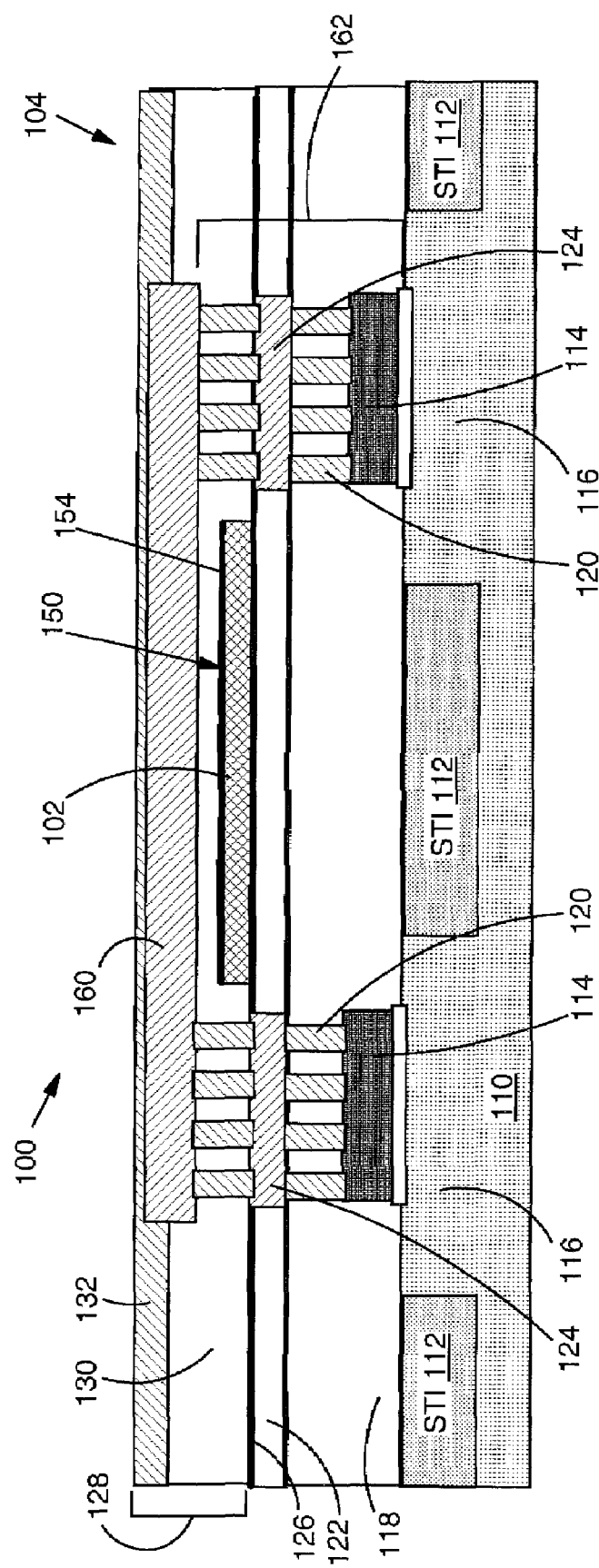
FIG. 1 shows a cross-sectional view of a heat dissipating structure according to one embodiment of the invention.
Figure 2:
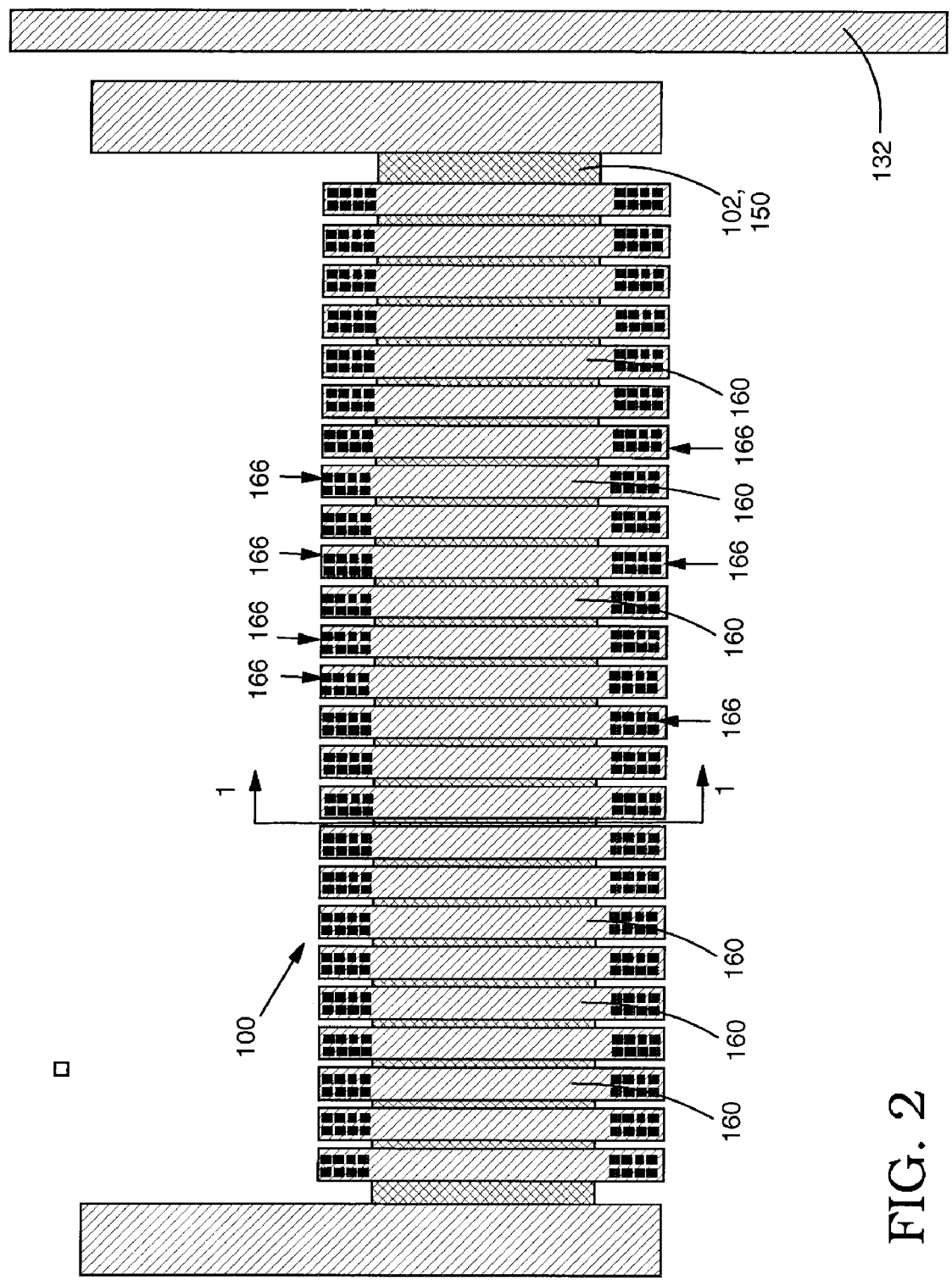
FIG. 2 shows a plan view of one embodiment of the structure of FIG. 1.
Figure 4:
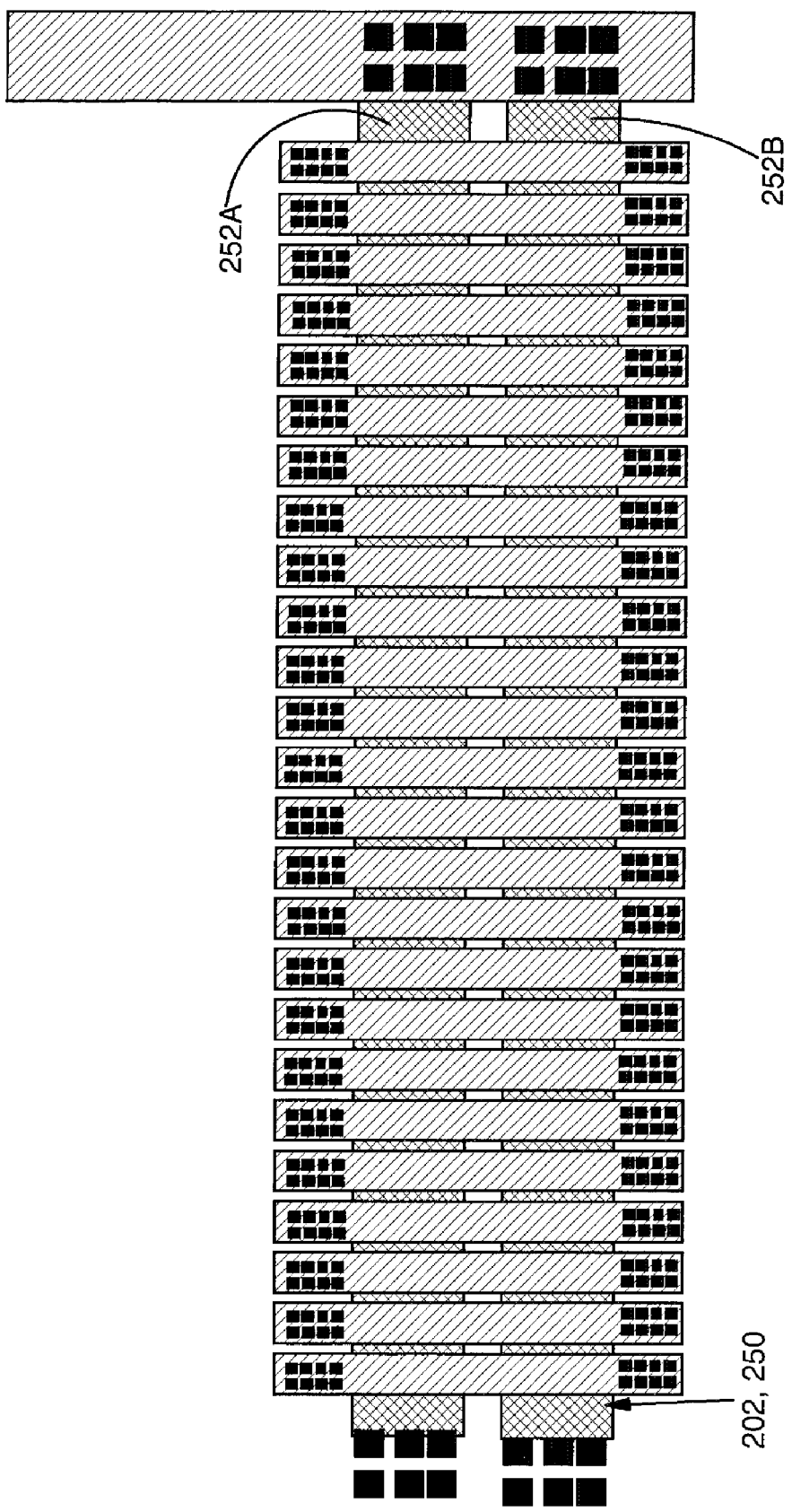
FIG. 4 shows a plan view of a second embodiment of the structure of FIG. 1.
Figure 5:
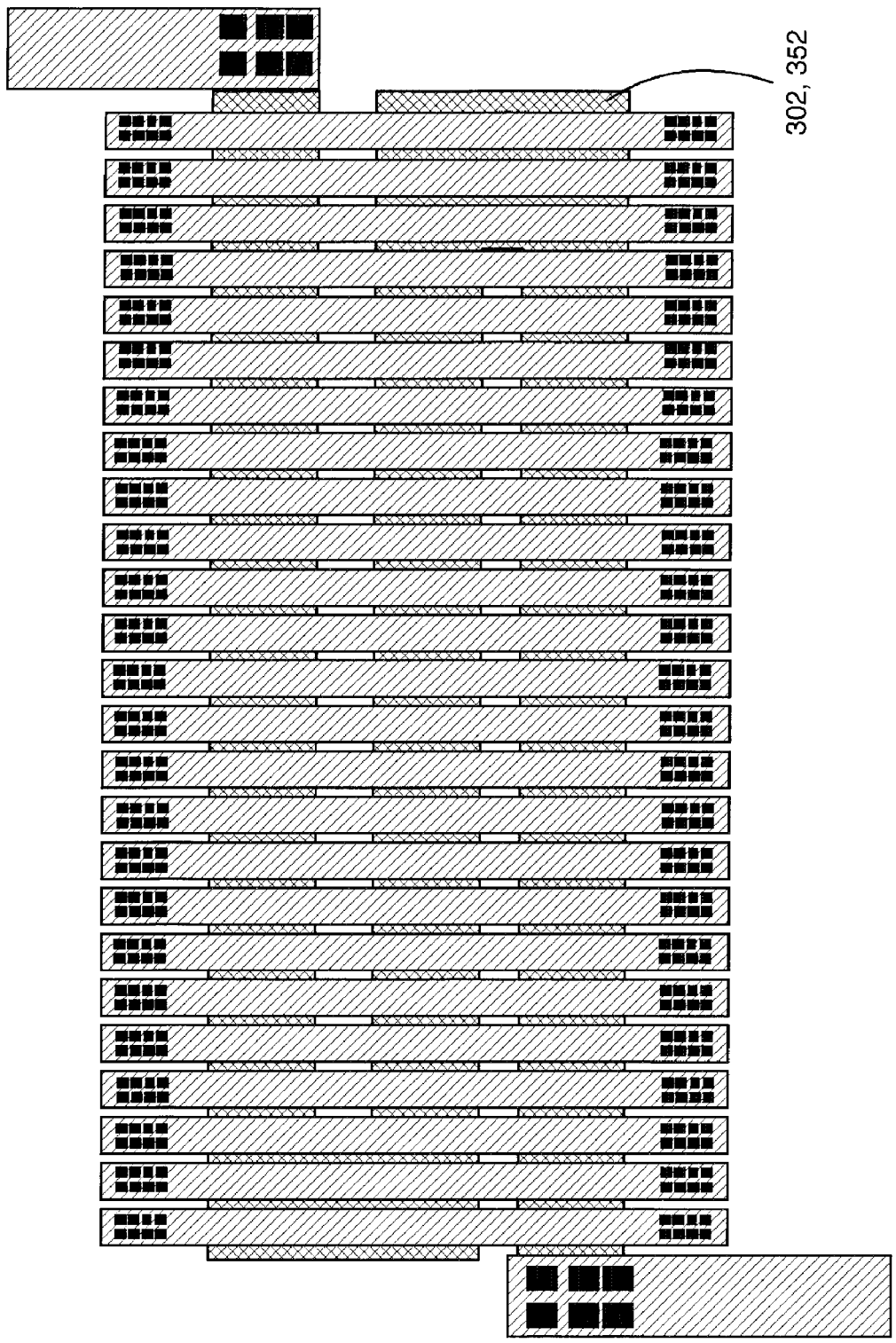
FIG. 5 shows a plan view of a third embodiment of the structure of FIG. 1.

With reference to the accompanying drawings, FIG. 1 shows a cross-sectional view of a structure 100 for heat dissipation relative to a heat generating element 102 in a semiconductor device 104. FIGS. 2, 4 and 5 show a plan view of structure 100 relative to first, second and third embodiments of a heat generating element 102, 202, 302, respectively. The semiconductor device 104 may include a conventional structure such as a silicon substrate 110 including shallow trench isolations (STI) 112, e.g., of silicon dioxide ($SiO_2$), a polysilicon gate structure 114 over silicon region 116, a dielectric cap 118 (e.g., tetraethyl orthosilicate ($Si(OC_2H_5)_4$)(TEOS) or boro-phospho-silicate glass (BPSG)), contact vias 120, a first back-end-of-line dielectric 122, conducting lines 124, and a sealing dielectric cap layer 126. Back-end-of-line metal layers 128 (only one shown for clarity) may include, for example, a typical dielectric 130, conducting lines 132 or any other conventional structure. All of the above-described structure is generated according to conventional processing.

In one embodiment, heat generating element 102 includes a precision resistor 150 (FIGS. 1–3 only) positioned in non-first metal layer 128 of semiconductor device 104. The precision resistor 150 may include any now known or later developed materials therefor such as tantalum nitride (TaN). A dielectric cap 154 may be provided over precision resistor 150. Typical design rules prohibit any first metal layer metal, e.g., conducting lines 124, below resistor 150, or any active second metal, e.g., conducting lines 132, above resistor 150.

Accordingly, heat generated by resistor 150 is conventionally transferred through dielectrics 118, 122, 126, 130, which increases the temperature of conducting lines 124 and 132 and degrades their electromigration performance. Although heat generating element 102 is described herein as a resistor 102, it should be recognized that the teachings of the invention are not limited to a resistor. For example, heat generating element 102 can be practically any device that generates heat within a semiconductor device 104. In addition, while heat generating element 102 has been shown in second metal layer 128, it should be recognized that the invention can be implemented for a heat generating element in any non-first (i.e., BEOL) metal layer desired.

Figure 3:
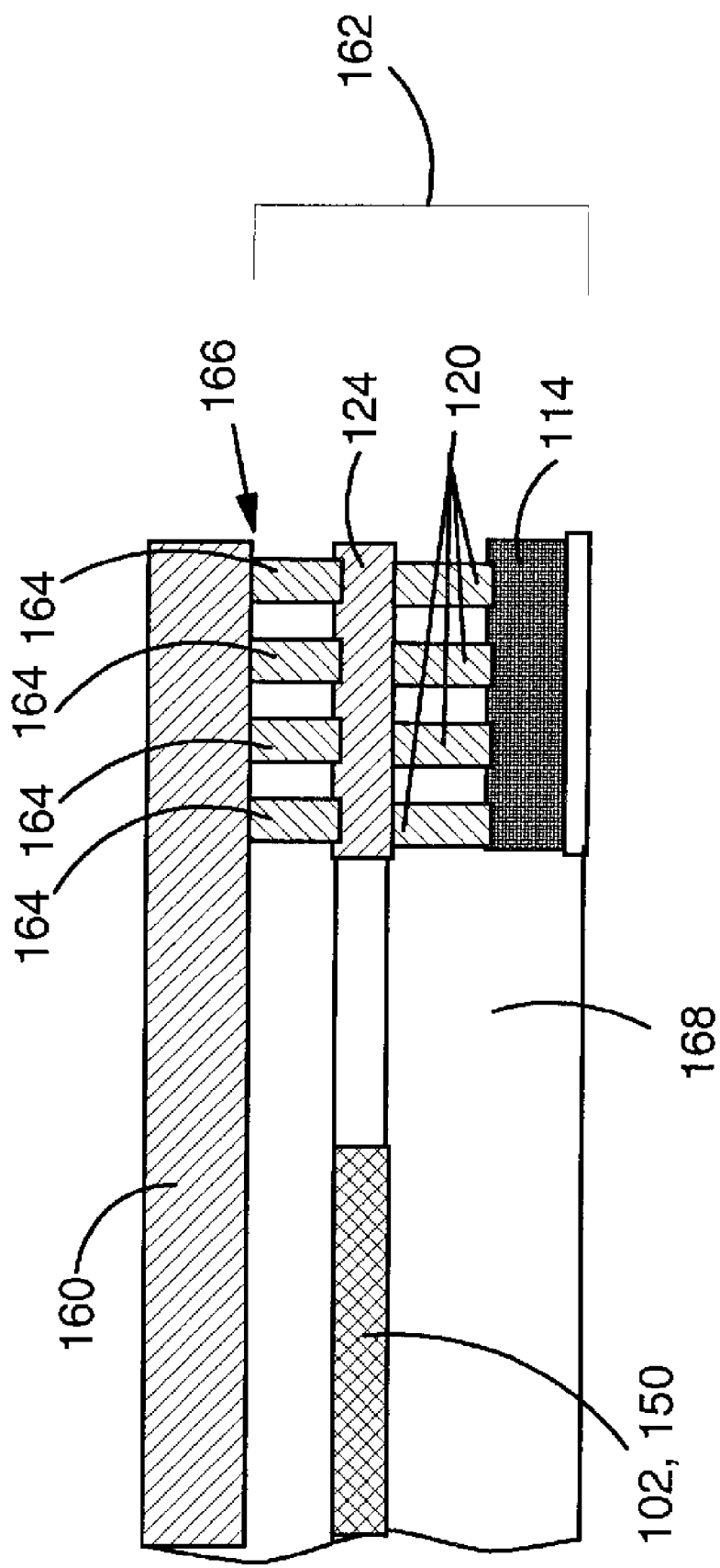
FIG. 3 shows a detailed cross-sectional view of an interconnecting path.
Figure 6:
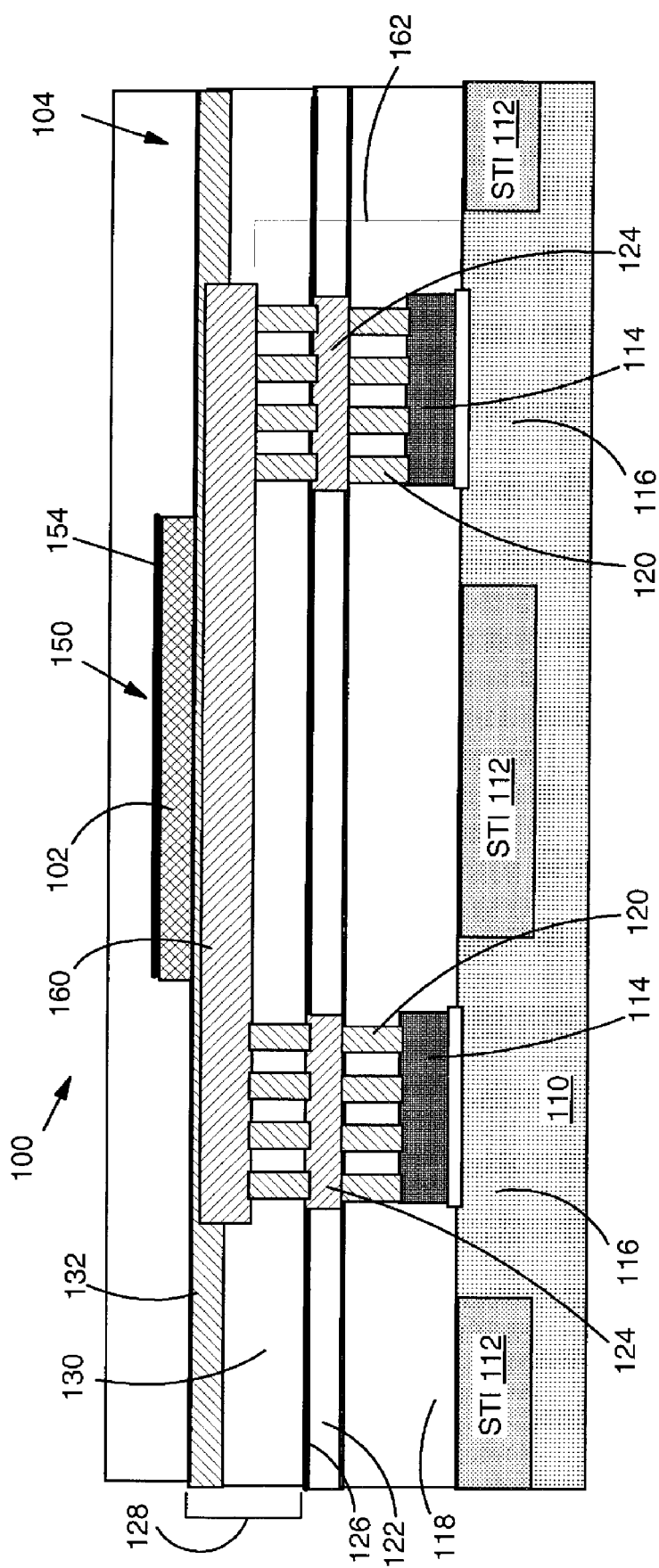
FIG. 6 shows a cross-sectional view of a heat dissipating structure according to an alternative embodiment of the invention.
Figure 7:
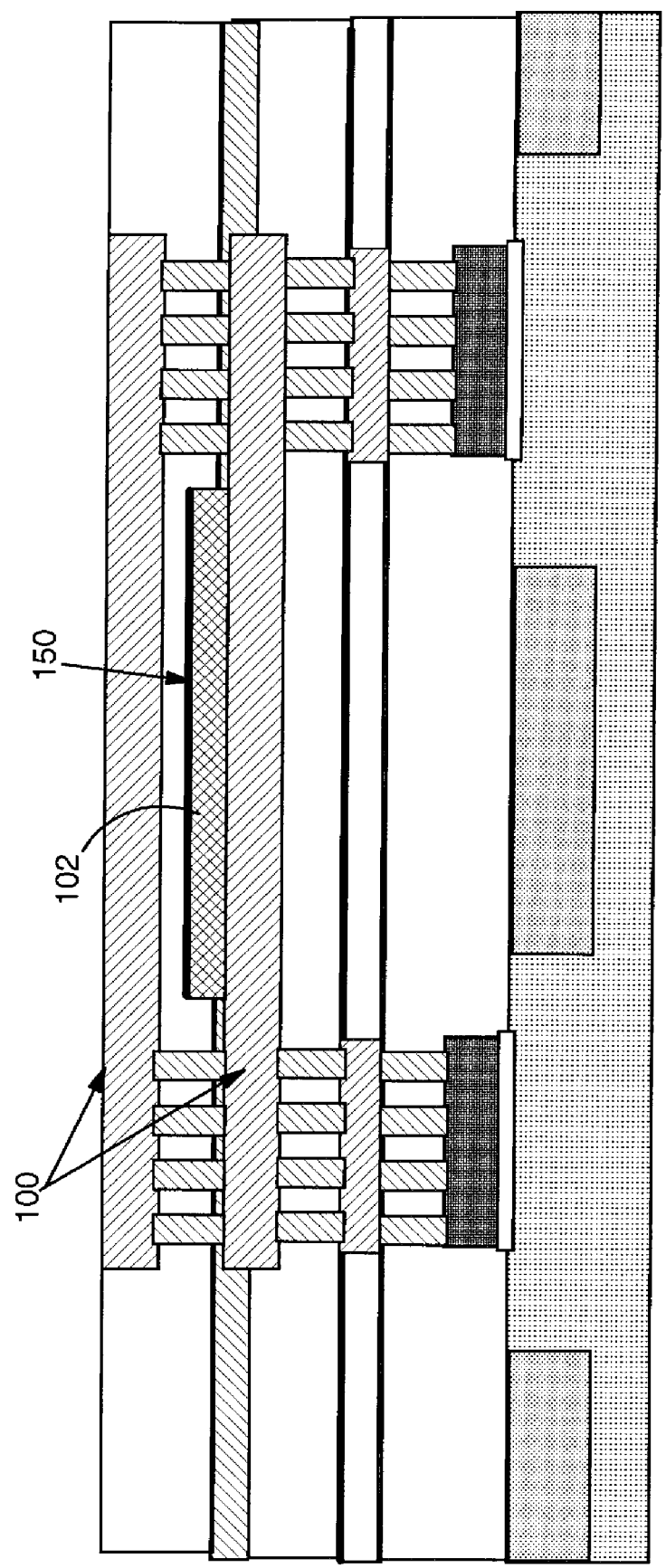
FIG. 7 shows a cross-sectional view of a heat dissipating structure according to another alternative embodiment of the invention.

As shown best in FIGS. 2 and 3, structure 100 includes a plurality of heat transmitting lines 160 partially vertically coincidental with heat generating element 102. FIG. 1 shows a cross-sectional view along line 1—1 in FIG. 2. "Partially vertically coincidental" means that heat transmitting lines 160 are either positioned to partly overlap heat generating element 102 (FIGS. 1–5) and/or be partly overlapped by heat generating element 102 (FIG. 6). FIG. 7 shows an alternative embodiment in which structures 100 are provided above and below heat generating element 102. Returning to FIGS. 2–3, heat transmitting lines 160 are thermally coupled to heat generating structure 102 via dielectric 130 (FIG. 1). Each heat transmitting line 160 includes a thermal conductive material such as a metal. Heat transmitting lines 160 are inactive, i.e., they do not conduct current. Accordingly, their position above or below heat generating element 102 does not violate any ground rules. Structure 100 also includes at least one interconnecting path 162 from each heat transmitting line 160 to substrate 110 of semiconductor device 104. In one embodiment, as shown in FIG. 3, each interconnecting path 162 includes a set of vias 164 thermally coupling an upper portion 166 of a respective interconnecting path 162 to a lower (metal) level 168. In addition, each interconnecting path 162 includes at least one metal line thermally coupled to a set of vias at each metal level between a respective heat transmitting line 160 and substrate 110. For structure 100 in second metal layer 128, as shown, at least one metal line may include conducting lines 124 of the first metal layer thermally coupled to vias 120. As shown in FIG. 2, a set of vias 166 is thermally coupled to each end of each heat transmitting line 160. However, this is not necessary, as one set on one end of a transmitting line 160, or one via 164 on each end may suffice in certain instances. As shown in FIGS. 1 and 3, each interconnecting path 162 terminates with a set of vias 120 thermally coupled to a polycrystalline gate structure 114 over substrate 110.

All of structure 100 including heat transmitting lines 160 and interconnecting paths 162 are inactive, i.e., they do not conduct current. Accordingly, their position above or below heat generating element 102 does not violate any ground rules.

Turning to FIGS. 2 and 4–5, heat generating element 102 in the form of a precision resistor may take a variety of forms. As shown in FIG. 2, resistor 150 includes a single part. However, as shown in FIG. 4, resistor 250 may include a plurality of parts 252A, 252B. Alternatively, as shown in FIG. 5, heat generating element 352 may have a serpentine shape. In any case, heat dissipating structure 100 may be sized to accommodate the different embodiments.

In operation, structure 100 provides heat dissipation from heat generating element 102, 202, 302 of semiconductor device 104 by transmitting heat from each of heat transmitting line 160 via at least one interconnecting path 162 from each heat transmitting line 160 to substrate 110 of semiconductor device 104. The invention thus allows the use of a BEOL resistor 150, 250, 350 with a very precise resistance and low temperature coefficient of resistance. In addition, removal of heat generated by the operation of resistor 150, 250, 350 into silicon substrate 110 allows neighboring conducting lines 132 to remain at a constant temperature, thus allowing for a high operating current.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A structure for heat dissipation relative to a heat generating element in a semiconductor device, the structure comprising:
   a plurality of heat transmitting lines partially vertically coincidental with the heat generating element and separated from the heat generating element by an electrically non-conductive material disposed therebetween; and
   at least one interconnecting path from each heat transmitting line to a substrate of the semiconductor device, each interconnecting path includes a set of vias thermally coupling an upper portion of a respective interconnecting path to the substrate.

2. The structure of claim 1, wherein the heat generating element includes a resistor In a non-first metal layer.

3. The of claim 2, wherein the resistor has a serpentine shape.

4. The of claim 1, wherein the heat generating element includes a plurality of parts.

5. The structure of claim 1, wherein each interconnecting path includes at least one metal line thermally coupled to a set of vias at each metal level between a respective heat transmitting line and the substrate.

6. The structure of claim 1, wherein a set of vias is thermally coupled to each end of each heat transmitting line.

7. The of claim 1, wherein each interconnecting path includes at least one set of:
   a set of vias coupling an upper portion of a respective interconnecting path to a lower, metal level, and
   at least one metal line at each metal level thermally coupled to the set of vias.

8. The of claim 1, wherein each interconnecting path terminates with a set of vias thermally coupled to a polycrystalline conductor over the substrate.

9. The of claim 1, wherein each heat transmitting line includes a metal.

10. A heat dissipating structure for a resistor in a semiconductor device, the structure comprising:
    a plurality of heat transmitting metallic lines partially vertically coincidental with the resistor and separated from the resistor by an electrically non-conductive material disposed therebetween; and
    at least one interconnecting path from each heat transmitting metallic line to a substrate of the semiconductor device, each interconnecting path includes a set of vias thermally coupling an upper portion of a respective interconnecting path to the substrate.

11. The of claim 10, wherein the resistor is positioned in a non-first metal level.

12. The structure of claim 10, wherein the resistor has a serpentine shape.

13. The structure of claim 10, wherein the resistor includes a plurality of parts.

14. The structure of claim 10, wherein each interconnecting path includes at least one set of:

a set of vias thermally coupling an upper portion of a respective interconnecting path to a lower, metal level, and at least one metal line at each metal level thermally coupled to the set of vias.

15. The structure of claim 10, wherein each interconnecting path terminates with a set of vias thermally coupled to a polycrystalline conductor over the substrate.

* * * * *